United States Patent
Kim

(10) Patent No.: US 7,336,101 B2
(45) Date of Patent: Feb. 26, 2008

(54) CONTROL CIRCUIT AND METHOD

(75) Inventor: Min-Su Kim, Hwaseong-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 44 days.

(21) Appl. No.: 11/324,295

(22) Filed: Jan. 4, 2006

(65) Prior Publication Data

US 2006/0145752 A1 Jul. 6, 2006

(30) Foreign Application Priority Data

Jan. 5, 2005 (KR) ...................... 10-2005-0000806

(51) Int. Cl.
*H03K 17/16* (2006.01)
(52) U.S. Cl. .............................. 326/81; 326/83; 326/26
(58) Field of Classification Search .................. 326/26, 326/27, 82–87; 327/534, 535
See application file for complete search history.

(56) References Cited

U.S. PATENT DOCUMENTS 5,821,769 A 10/1998 Douseki
6,118,328 A * 9/2000 Morikawa .................... 327/534
6,933,744 B2 * 8/2005 Das et al. ..................... 326/17

FOREIGN PATENT DOCUMENTS

KR 10-201-0100940 11/2001
KR 10-0327815 4/2002

OTHER PUBLICATIONS

Office Action for corresponding Korean application No. KR 10-2005-000806 dated May 26, 2006 and English translation thereof.

* cited by examiner

*Primary Examiner*—Don Le
(74) *Attorney, Agent, or Firm*—Harness, Dickey & Pierce, P.L.C.

(57) ABSTRACT

A control circuit including a first control unit, controlling a logic circuit, connected between a power supply and a virtual ground, the control unit connecting the virtual ground to a ground in response to a mode control signal when the logic circuit operates in an active mode and disconnecting the virtual ground from the ground in response to the mode control signal when the logic circuit operates in a sleep mode. A method of controlling including connecting the logic circuit between a power supply and a virtual ground, connecting the virtual ground to a ground in response to a mode control signal when the logic circuit operates in an active mode, and disconnecting the virtual ground from the ground in response to the mode control signal when the logic circuit operates in a sleep mode.

21 Claims, 4 Drawing Sheets

CONTROL CIRCUIT AND METHOD

PRIORITY STATEMENT

This application claims the benefit of Korean Patent Application No. 10-2005-0000806, filed on Jan. 5, 2005, in the Korean Intellectual Property Office, the disclosure of which is incorporated herein in its entirety by reference.

BACKGROUND OF THE INVENTION

1. Field of the Invention

Example embodiments of the present invention relate to a control circuit and method, for example, a multi-threshold complementary metal-oxide semiconductor (MTCMOS) control circuit, and more particularly, to a MTCMOS control circuit which reduces or prevents the performance of a logic circuit from deteriorating due to transistors using MTCMOS technology and/or reduces or minimizes the amount of leakage current when the logic circuit is in sleep mode.

2. Description of the Related Art

In general, in multi-threshold complementary metal-oxide semiconductor (MTCMOS) technology, a metal-oxide semiconductor (MOS) transistor having a relatively high threshold voltage is connected in series between a power supply (or ground) and a logic circuit.

For example, when the logic circuit, which includes a plurality of transistors with a relatively low threshold voltage, is in active mode, e.g., when the logic circuit is powered on, the MOS transistor is turned on, thereby supplying power to the logic circuit and enhancing the operating speed of the logic circuit. When the logic circuit is in sleep mode, e.g., when the logic circuit is powered down, the MOS transistor is turned off, thereby cutting off a power supply voltage or a ground voltage applied to the logic circuit and reducing a leakage current.

Such MTCMOS technology is useful for reducing the power consumption of portable large-scale integration chips which are put into sleep mode for a longer period of time than in active mode.

FIG. 1 is a circuit diagram of a conventional MTCMOS control circuit 100. Referring to FIG. 1, a PMOS transistor MP may be connected in series between a virtual power supply VDDV and a power supply VDD, and an NMOS transistor may be connected in series between a virtual ground VSSV and a ground VSS. A logic circuit 110 may be connected between the virtual power supply voltage VDDV and the virtual ground VSSV. The logic circuit 110 is an example circuit, and may be replaced with any other circuit.

The logic circuit 110 may include a plurality of transistors 111 through 117 and a NAND unit 119. Even though the logic circuit 110 is illustrated in FIG. 1 as including the transistors 111 through 117 and the NAND unit 119, the structure of the logic circuit 110 may be different from the structure illustrated in FIG. 1.

The transistors 111 through 117 and the NAND unit 119 in the logic circuit 110 may have a relatively low threshold voltage. The PMOS transistor MP and the NMOS transistor MN may have a relatively high threshold voltage.

In active mode, the PMOS transistor MP and the NMOS transistor MN may be turned on in response to mode control signals SL and SLB, respectively, the virtual power supply VDDV may be connected to the power supply VDD, and the virtual ground VSSV may be connected to the ground VSS.

Because the transistors 111 through 117 and the NAND unit 119 are lower-threshold voltage devices, the logic circuit 110 may operate with higher performance, a leakage current generated during the operation of the logic circuit 110 may be less than a dynamic current, and thus the leakage current may be ignored.

In sleep mode, the PMOS transistor MP and the NMOS transistor MN may be turned off in response to the mode control signals SL and SLB, respectively, and thus, the logic circuit 110 stops operating. Therefore, no leakage current flows in the logic circuit 110.

Because the PMOS transistor MP and the NMOS transistor MN have a relatively high threshold voltage, the amount of leakage current flowing into the logic circuit 110 via the PMOS or NMOS transistor MP or MN may be reduced. Therefore, the amount of leakage current generated in the logic circuit 110 and/or the power consumption of the logic circuit 110 may be reduced when the logic circuit 110 operates in sleep mode by using the PMOS transistor MP and the NMOS transistor MN.

FIG. 2 is a circuit diagram of a conventional MTCMOS control circuit 200 using a PMOS transistor, and FIG. 3 is a circuit diagram of a conventional MTCMOS control circuit 300 using an NMOS transistor. Referring to FIGS. 2 and 3, logic circuits 210 and 310 may have the same structure as the logic circuit 110 of FIG. 1. Referring to FIG. 2, the MTCMOS control circuit 200 may realize a connection between a virtual power supply VDDV and a power supply VDD, using a PMOS transistor MP. Referring to FIG. 3, the MTCMOS control circuit 300 may realize a connection between a virtual ground VSSV and a ground VSS, using an NMOS transistor MN.

The MTCMOS control circuit 200 may be realized using a well of a PMOS transistor and thus can be manufactured in a conventional bulk method. The MTCMOS control circuit 300 may be manufactured in a method using a well of an NMOS transistor.

For example, the MTCMOS control circuit 300 may be manufactured by a method using a well of an NMOS transistor or using a triple well including a well of a PMOS transistor and a well of an NMOS transistor. The MTCMOS control circuit 100 of FIG. 1 may be obtained by integrating the MTCMOS control circuit 200 of FIG. 2 and the MTCMOS control circuit 300 of FIG. 3 into a single circuit and may be manufactured by a method using a triple well.

However, more leakage current may be generated in the MTCMOS control circuits 100, 200, and 300 of FIGS. 1, 2, and 3, for example, when the transistors in the logic circuits 110, 210, and 310 are manufactured to have a critical dimension of 90 nm or lower. In the active mode, the performance of the logic circuits 110, 210, and 310 may deteriorate due to the reverse body bias effect of the transistors in the logic circuits 110, 210, and 310.

FIG. 4 is a circuit diagram of a logic circuit illustrating one ore more problems with the conventional MTCMOS control circuits 100, 200, and 300 of FIGS. 1, 2, and 3, respectively. Referring to FIG. 4, transistor 117 represents an arbitrary NMOS transistor in a logic circuit. A body of the transistor 117 may be connected to a ground VSS. When the logic circuit operates in active mode, an NMOS transistor MN is turned on in response to a mode control signal SL, and a virtual ground VSSV is connected to a ground VSS. However, the NMOS transistor MN has resistance even when turned on. Thus, the voltage of the virtual ground VSSV becomes slightly higher than the voltage of the ground VSS due to the resistance of the NMOS transistor MN.

For example, if the NMOS transistor MN has a voltage of about 0.1 V due to its resistance, the voltage of the virtual ground VSSV may be higher than the voltage of the ground VSS by about 0.1 V.

Because the body of the transistor 117 is connected to the ground VSS, the voltage between the body and a source of the transistor 117 becomes −0.1 V, thus generating an inverse voltage. This phenomenon is referred to as the reverse body bias effect. Due to the reverse body bias effect, the performance of the transistor 117 may deteriorate and/or the operating speed of a chip including the logic circuit may decrease.

In a case where the transistor 117 is a PMOS transistor, the body of the transistor 117 is connected to the power supply VDD, thereby causing the same problems as in a case where the transistor 117 is an NMOS transistor.

SUMMARY OF THE INVENTION

Example embodiments of the present invention provide a control circuit, for example, an MTCMPS control circuit, which reduces or prevents the performance of a logic circuit from deteriorating due to the reverse body bias effect and reduces the amount of leakage current by controlling the body voltage of transistors using MTCMOS technology.

According to an example embodiment of the present invention, there is provided a control circuit including a control unit, controlling a logic circuit, connected between a power supply and a virtual ground, the control unit connecting the virtual ground to a ground in response to a mode control signal when the logic circuit operates in an active mode and disconnecting the virtual ground from the ground in response to the mode control signal when the logic circuit operates in a sleep mode.

In an example embodiment, an internal voltage of the first control unit varies according to the operating mode of the logic circuit.

In an example embodiment, the control unit may include an NMOS transistor which is connected between the virtual ground and the ground and has a gate to which the mode control signal is applied, and the body voltage of the NMOS transistor may vary according to the operating mode of the logic circuit.

In an example embodiment, the body voltage of the NMOS transistor may increase when the logic circuit operates in the active mode and may decrease when the logic circuit operates in the sleep mode.

In an example embodiment, the body voltage of the NMOS transistor may increase when the logic circuit operates in the active mode and may not change when the logic circuit operates in the sleep mode.

In an example embodiment, the body voltage of the NMOS transistor may not change when the logic circuit operates in the active mode and may decrease when the logic circuit operates in the sleep mode.

In an example embodiment, the control circuit may also include a body control signal generation unit which controls the body voltage of the NMOS transistor by generating a body control signal having a voltage higher than a ground voltage when the logic circuit operates in the active mode and generating a body control signal having a voltage equal to or lower than the ground voltage when the logic circuit operates in the sleep mode.

In an example embodiment, the body control signal generation unit may include a first switch which generates the body control signal having a voltage higher than the ground voltage from a first voltage source in response to the mode control signal when the logic circuit operates in the active mode; and a second switch which generates the body control signal having a voltage equal to or lower than the ground voltage from a second voltage source in response to the mode control signal when the logic circuit operates in the sleep mode.

In an example embodiment, the MTCMOS control circuit may also include a mode control signal generation unit which generates the mode control signal, wherein the mode control signal has a logic high level when the logic circuit operates in the active mode and has a logic low level when the logic circuit operates in the sleep mode.

According to another example embodiment of the present invention, there is provided a control circuit including a first control unit which connects the virtual ground to a ground in response to a mode control signal when a logic circuit operates in active mode and disconnects the virtual ground from the ground in response to the mode control signal when the logic circuit operates in sleep mode and a second control unit which connects the virtual power supply to a power supply in response to an inverted mode control signal when the logic circuit operates in the active mode and disconnects the virtual power supply from the power supply in response to the inverted mode control signal when the logic circuit operates in the sleep mode, the inverted mode control signal being generated by inverting the mode control signal.

In an example embodiment, the internal voltages of the first and second control units vary according to the operating mode of the logic circuit.

In an example embodiment, the first control unit may include an NMOS transistor which is connected between the virtual ground and the ground and has a gate to which the mode control signal is applied, and the body voltage of the NMOS transistor may vary according to the operating mode of the logic circuit.

In an example embodiment, the body voltage of the NMOS transistor may increase when the logic circuit operates in the active mode and may decrease when the logic circuit operates in the sleep mode.

In an example embodiment, the second control unit may include a PMOS transistor which is connected between the virtual power supply and the power supply and has a gate to which the inverted mode control signal is applied, and the body voltage of the PMOS transistor may vary according to the operating mode of the logic circuit.

In an example embodiment, the body voltage of the PMOS transistor may decrease when the logic circuit operates in the active mode and may increase when the logic circuit operates in the sleep mode.

According to another example embodiment of the present invention, there is provided a method of controlling a logic circuit, including connecting the logic circuit between a power supply and a virtual ground, connecting the virtual ground to a ground in response to a mode control signal when the logic circuit operates in an active mode, and disconnecting the virtual ground from the ground in response to the mode control signal when the logic circuit operates in a sleep mode.

BRIEF DESCRIPTION OF THE DRAWINGS

The above and other features and advantages of example embodiments of the present invention will become more apparent by describing in detail example embodiments thereof with reference to the attached drawings in which.

DETAILED DESCRIPTION OF EXAMPLE EMBODIMENTS OF THE INVENTION

Figure 1:
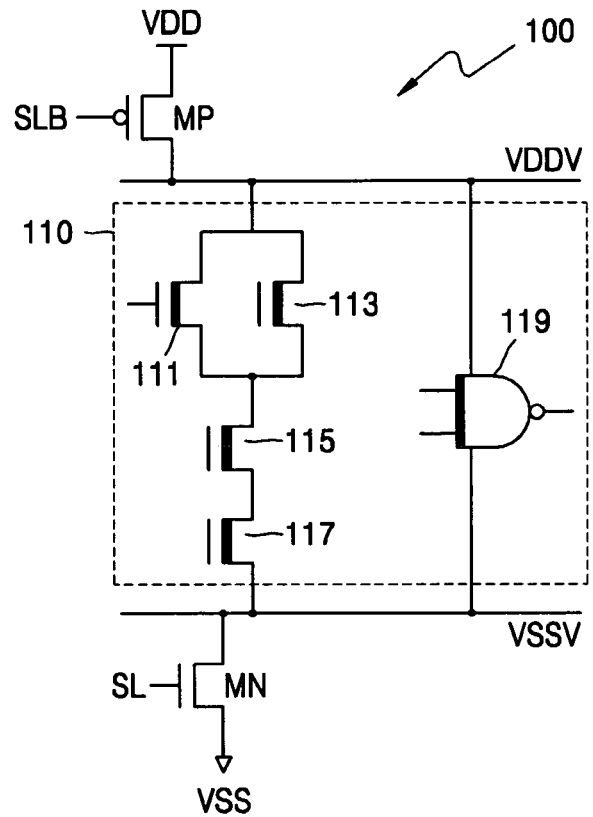
FIG. 1 is a circuit diagram of a conventional MTCMOS control circuit.
Figure 2:
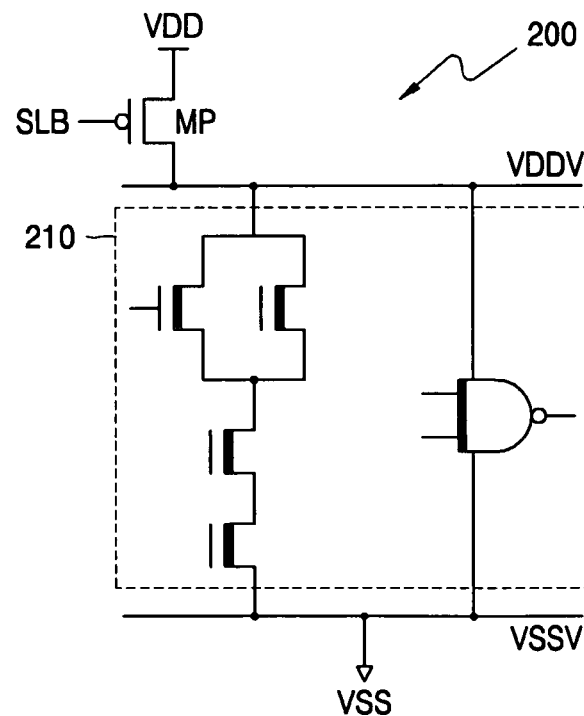
FIG. 2 is a circuit diagram of a conventional MTCMOS control circuit using a PMOS transistor.

The present invention will now be described more fully with reference to the accompanying drawings in which example embodiments of the invention are shown. In the drawings, like reference numerals represent like elements.

Various example embodiments of the present invention will now be described more fully with reference to the accompanying drawings in which some example embodiments of the invention are shown. In the drawings, the thicknesses of layers and regions may be exaggerated for clarity.

Detailed illustrative embodiments of the present invention are disclosed herein. However, specific structural and functional details disclosed herein are merely representative for purposes of describing example embodiments of the present invention. This invention may, however, may be embodied in many alternate forms and should not be construed as limited to only the embodiments set forth herein.

Accordingly, while example embodiments of the invention are capable of various modifications and alternative forms, embodiments thereof are shown by way of example in the drawings and will herein be described in detail. It should be understood, however, that there is no intent to limit example embodiments of the invention to the particular forms disclosed, but on the contrary, example embodiments of the invention are to cover all modifications, equivalents, and alternatives falling within the scope of the invention. Like numbers refer to like elements throughout the description of the figures.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of example embodiments of the present invention. As used herein, the term "and/or" includes any and all combinations of one or more of the associated listed items.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between", "adjacent" versus "directly adjacent", etc.).

The terminology used herein is for the purpose of describing particular embodiments only and is not intended to be limiting of example embodiments of the invention. As used herein, the singular forms "a", "an" and "the" are intended to include the plural forms as well, unless the context clearly indicates otherwise. It will be further understood that the terms "comprises", "comprising,", "includes" and/or "including", when used herein, specify the presence of stated features, integers, steps, operations, elements, and/or components, but do not preclude the presence or addition of one or more other features, integers, steps, operations, elements, components, and/or groups thereof.

It will be understood that when an element or layer is referred to as being "on" "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numbers refer to like elements throughout. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the scope of example embodiments of the present invention.

Spatially relative terms, such as "beneath", "below", "lower", "above", "upper" and the like, may be used herein for ease of description to describe one element or a feature's relationship to another element or feature as illustrated in the Figures. It will be understood that the spatially relative terms are intended to encompass different orientations of the device in use or operation in addition to the orientation depicted in the Figures. For example, if the device in the Figures is turned over, elements described as "below" or "beneath" other elements or features would then be oriented "above" the other elements or features. Thus, for example, the term "below" can encompass both an orientation which is above as well as below. The device may be otherwise oriented (rotated 90 degrees or viewed or referenced at other orientations) and the spatially relative descriptors used herein should be interpreted accordingly.

The terminology used herein is for the purpose of describing particular embodiments only and is not intended to be limiting of example embodiments of the invention. As used herein, the singular forms "a", "an" and "the" are intended to include the plural forms as well, unless the context clearly indicates otherwise. It will be further understood that the terms "comprises," "comprising," "includes" and/or "including," when used in this specification, specify the presence of stated features, integers, steps, operations, elements, and/or components, but do not preclude the presence or addition of one or more other features, integers, steps, operations, elements, components, and/or groups thereof.

Example embodiments of the present invention are described herein with reference to cross-sectional illustrations that are schematic illustrations of idealized embodiments (and intermediate structures). As such, variations from the shapes of the illustrations as a result, for example, of manufacturing techniques and/or tolerances, may be expected. Thus, example embodiments of the invention should not be construed as limited to the particular shapes of regions illustrated herein but may include deviations in shapes that result, for example, from manufacturing.

It should also be noted that in some alternative implementations, the functions/acts noted may occur out of the order noted in the FIGS. For example, two FIGS. shown in succession may in fact be executed substantially concurrently or may sometimes be executed in the reverse order, depending upon the functionality/acts involved.

Unless otherwise defined, all terms (including technical and scientific terms) used herein have the same meaning as commonly understood by one of ordinary skill in the art to which example embodiments of the present invention belong. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

In order to more specifically describe example embodiments of the present invention, various aspects of the present invention will be described in detail with reference to the attached drawings. However, the present invention is not limited to the example embodiments described. In the figures, if a layer is formed on another layer or a substrate, it means that the layer is directly formed on another layer or a substrate, or that a third layer is interposed therebetween. In the following description, the same reference numerals denote the same elements.

Figure 5:
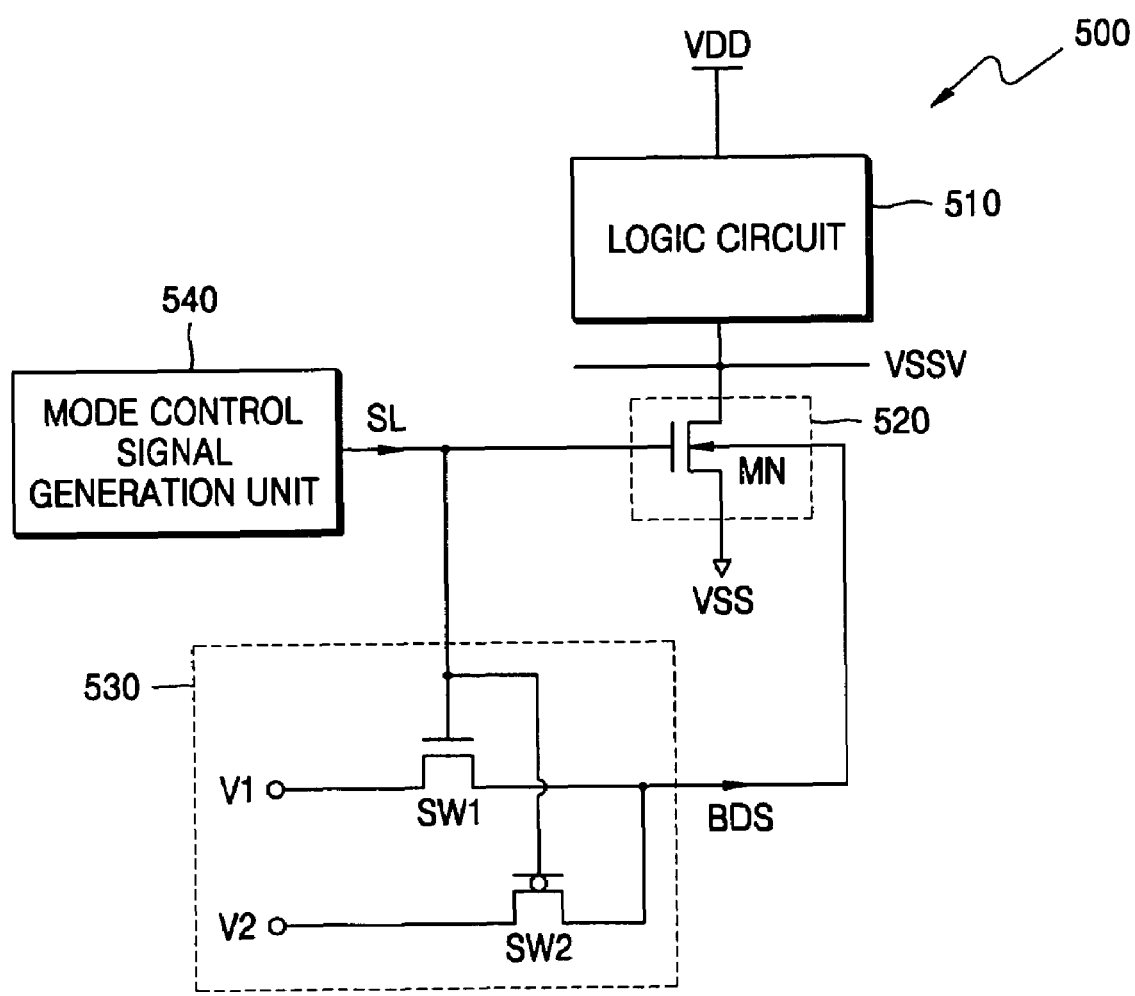
FIG. 5 is a circuit diagram of an MTCMOS control circuit according to an example embodiment of the present invention.

FIG. 5 is a circuit diagram of an MTCMOS control circuit 500 according to an example embodiment of the present invention. Referring to FIG. 5, the MTCMOS control circuit 500 may include a logic circuit 510 and/or a control unit 520.

The logic circuit 510 may be connected between a power supply VDD and a virtual ground VSSV. When the logic circuit 510 operates in active mode, the control unit 520 may connect the virtual ground VSSV to a ground VSS in response to a mode control signal SL.

When the logic circuit 510 operates in sleep mode, the control unit 520 may disconnect the virtual ground VSSV from the ground VSS in response to the mode control signal SL. The voltage inside the control unit 520 may vary according to whether the logic circuit 510 operates in active mode or sleep mode.

The control unit 520 may be implemented as an NMOS transistor MN which is connected between the virtual ground VSSV and the ground VSS and may have a gate to which the mode control signal SL is applied. The voltage of a body of the NMOS transistor MN may vary according to the operating mode of the logic circuit 510.

Example operation of the MTCMOS control circuit 500 will now be described in detail with reference to FIG. 5.

Figure 3:
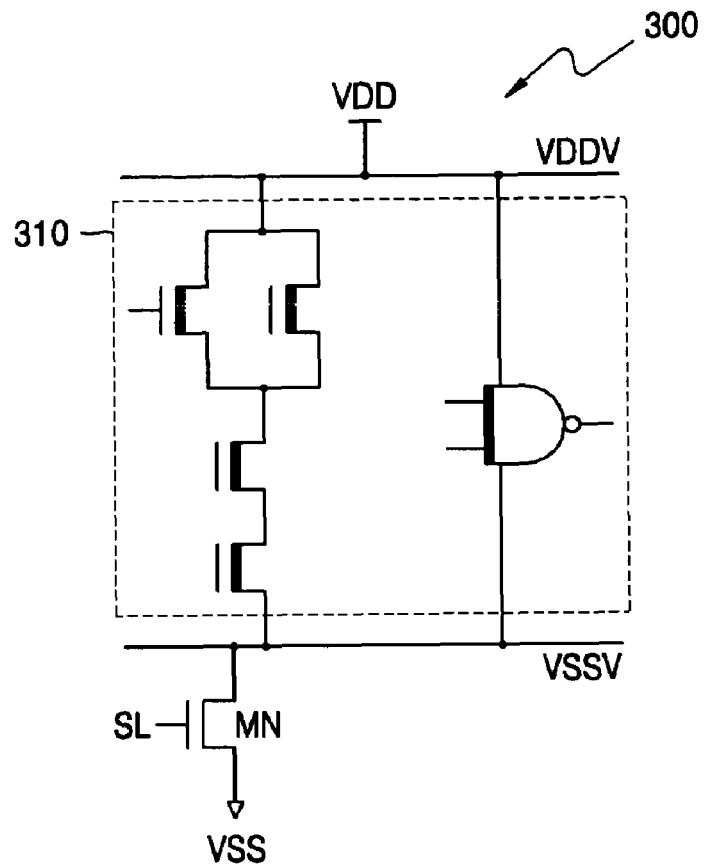
FIG. 3 is a circuit diagram of a conventional MTCMOS control circuit using an NMOS transistor.
Figure 4:
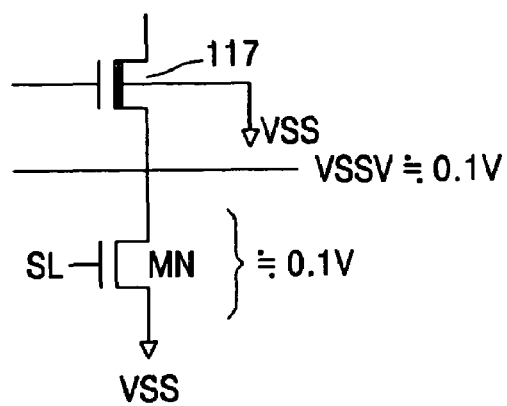
FIG. 4 is a circuit diagram of a logic circuit illustrating one or more problems with the conventional MTCMOS control circuits of FIGS. 1 through 3.

In the MTCMOS control circuit 500, like in the conventional MTCMOS control circuit 300 of FIG. 3, the logic circuit 510 may be powered down by connecting the NMOS transistor MN, having a threshold voltage between the virtual ground VSSV and the ground VSS. In an example embodiment, an adaptive body bias technique may be applied to the NMOS transistor MN. For example, the body voltage of the NMOS transistor MN may be altered according to the operating mode of the logic circuit 510, thereby preventing the performance of the logic circuit 510 from deteriorating.

The logic circuit 510 may be an arbitrary circuit, and a plurality of NMOS transistors (not shown) included in the logic circuit 510 may have a relatively low threshold voltage. When the logic circuit 510 operates in active mode, the body voltage of the NMOS transistor MN of the control unit 520 increases. When the logic circuit 510 operates in sleep mode, the body voltage of the NMOS transistor MN of the control unit 520 decreases. The NMOS transistor MN has a relatively high threshold voltage.

When the logic circuit 510 operates in active mode, the NMOS transistor MN is turned on in response to the mode control signal SL. The virtual ground VSSV may be connected to the ground VSS such that the body voltage of the NMOS transistor MN increases.

When the body voltage of the NMOS transistor MN increases, the threshold voltage and internal resistance of the NMOS transistor MN decrease. Therefore, the voltage of the virtual ground VSSV increases less considerably than the voltage of the virtual ground VSSV so that the voltage of the virtual ground VSSV eventually becomes almost equal to the voltage of the ground VSS.

As a result, the reveres body bias effect of the NMOS transistors (not shown) in the logic circuit 510 may be reduced or minimized, and thus, the performance of the logic circuit 510 may be improved.

When the logic circuit 510 operates in sleep mode, the NMOS transistor MN is turned off in response to the mode control signal SL. The logic circuit 510 may also be powered down, and the body voltage of the NMOS transistor MN decreases.

The threshold voltage of the NMOS transistor MN increases, and the amount of leakage current decreases. In this manner, when the logic circuit 510 operates in sleep mode, the amount of leakage current decreases.

As described above, the body voltage of the NMOS transistor MN may increase in one operating mode of the logic circuit 510 and may decrease in the other operating mode of the logic circuit 510. Alternatively, the NMOS transistor MN may be designed so that its body voltage increases or decreases in one operating mode of the logic circuit 510 but does not change in the other operating mode of the logic circuit 510.

For example, the NMOS transistor MN may be designed so that its body voltage increases when the logic circuit 510 operates in active mode and does not change when the logic circuit 510 operates in sleep mode. The reverse body bias effect may be reduced or prevented when the logic circuit 510 operates in active mode, and thus, the performance of the logic circuit 510 can be improved.

The NMOS transistor MN may be designed so that its body voltage does not change when the logic circuit 510 operates in active mode and decreases when the logic circuit 510 operates in sleep mode. The amount of leakage current generated when the logic circuit 510 is powered down, and is thus put in sleep mode, may be reduced.

The MTCMOS control circuit 500 may also include a mode control signal generation unit 540 which generates the mode control signal SL for controlling the NMOS transistor MN of the control unit 520.

The mode control signal SL generated by the mode control signal generation unit 540 may have a logic high level when the logic circuit 510 operates in active mode and may have a logic low level when the logic circuit 510 operates in sleep mode. The structure of the mode control signal generation unit 540, which controls the logic level of the mode control signal SL according to the operating mode of the logic circuit 510, may be obvious to one of ordinary skill in the art, and thus, its detailed description will be omitted.

The MTCMOS control circuit 500 may also include a body control signal generation unit 530 which may generate a body control signal BDS for controlling the body voltage of the NMOS transistor MN of the control unit 520.

The body control signal BDS generated by the body control signal generation unit 530 may have a voltage higher than a ground voltage when the logic circuit 510 operates in active mode and may have a voltage equal to or lower than the ground voltage when the logic circuit 510 operates in sleep mode.

The structure of the body control signal generation unit 530, which controls the voltage of the body control signal BDS according to the operating mode of the logic circuit 510, may vary. FIG. 5 illustrates an example of the structure of the body control signal generation unit 530. The body control signal generation unit 530 may have a structure other than the structure illustrated in FIG. 5.

The body control signal generation unit 530 may include a first switch SW1 and a second switch SW2. When the logic circuit 510 operates in active mode, the first switch SW1 may generate a body control signal BDS having a voltage higher than the ground voltage from a first voltage source V1 in response to the mode control signal SL.

The first switch SW1 may be an NMOS transistor. When the logic circuit 510 operates in active mode, the mode control signal may have a logic high level. Thus, the first switch SW1 may be turned on and generate a body control signal BDS having a voltage higher than the ground voltage from the first voltage source V1. The body control signal BDS generated by the first switch SW1 may increase the body voltage of the NMOS transistor MN.

When the logic circuit 510 operates in sleep mode, the second switch SW2 may generate a body control signal BDS having a voltage equal to or lower than the ground voltage from a second voltage source V2 in response to the mode control signal SL.

The second switch SW2 may be a PMOS transistor. When the logic circuit 510 operates in sleep mode, the mode control signal SL may have a logic low level. Thus, the second switch SW2 may turn on and generate a body control signal BDS having a voltage equal to or lower than the ground voltage from the second voltage source V2. The body control signal BDS generated by the second switch SW2 may reduce the body voltage of the NMOS transistor MN.

In general, in MTCMOS technology, the amount of leakage current is twice as large when a PMOS transistor is connected to a power supply than when an NMOS transistor is connected to the power supply. In addition, the performance of a logic circuit deteriorates more when implementing a MTCMOS control circuit using a PMOS transistor than when implementing the MTCMOS control circuit using an NMOS transistor. Moreover, a PMOS transistor is larger than an NMOS transistor. Therefore, the MTCMOS control circuit 500 may be designed to include the NMOS transistor MN, as the control unit 520, rather than a PMOS transistor.

As described above, in example embodiments, the performance of a logic circuit 510 may be improved or maintained due to the reverse body bias effect and/or an amount of leakage current may be reduced by altering the body voltage of the NMOS transistor MN, which connects the virtual ground VSSV to the ground VSS when the logic circuit 510 operates in active mode and powers down the logic circuit 510 so that the logic circuit 510 is put in sleep mode, according to the operating mode of the logic circuit 510.

Figure 6:
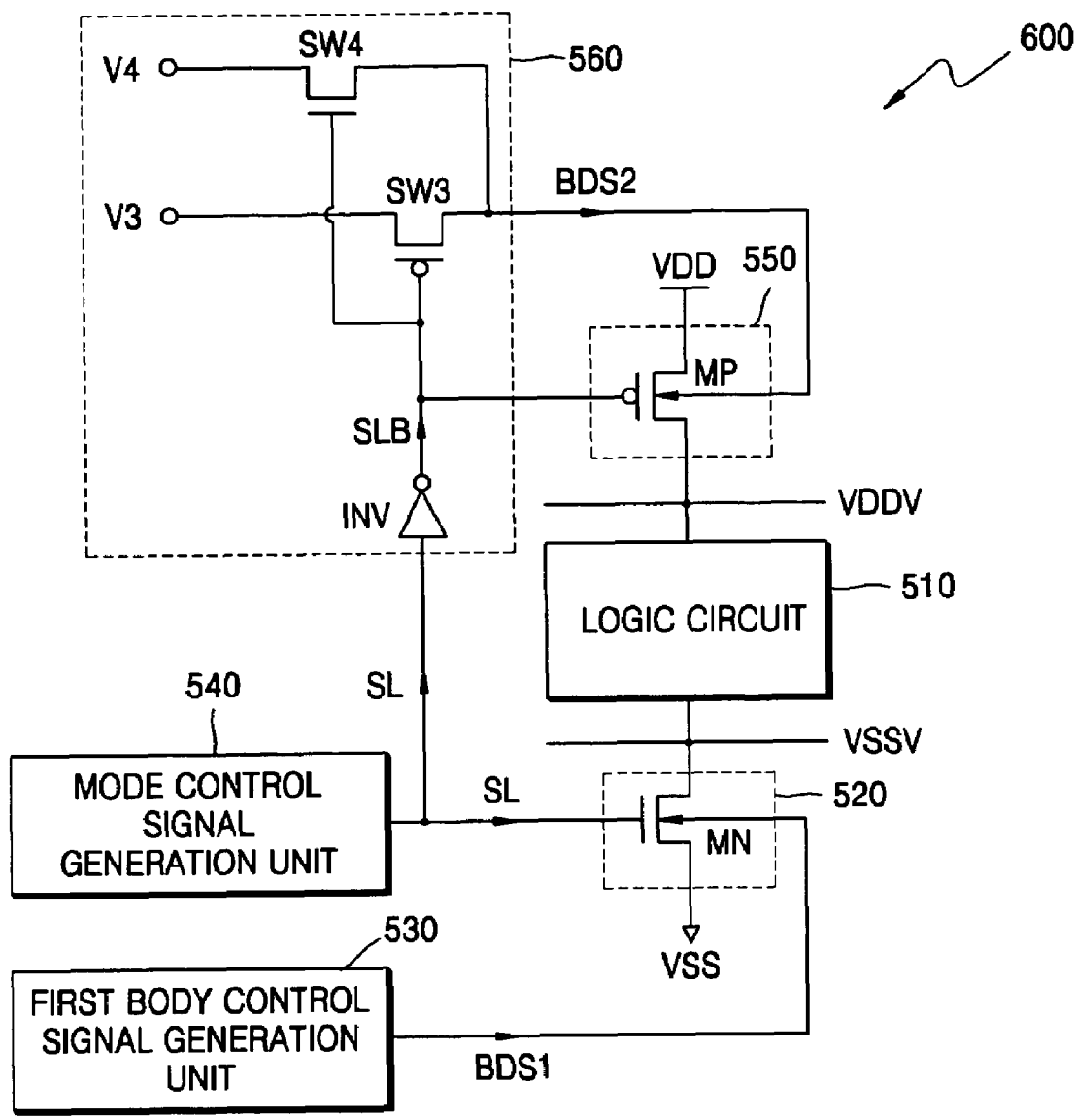
FIG. 6 is a circuit diagram of an MTCMOS control circuit according to another example embodiment of the present invention.

FIG. 6 is a circuit diagram of an MTCMOS control circuit 600 according to another example embodiment of the present invention. Referring to FIG. 6, the MTCMOS control circuit 600 may include a logic circuit 510, which is connected between a virtual power supply VDDV and a virtual ground VSSV, a first control unit 520, and/or a second control unit 550.

When the logic circuit 510 operates in active mode, the first control unit 520 may connect the virtual ground VSSV to a ground VSS in response to a mode control signal SL. When the logic circuit 510 operates in sleep mode, the first control circuit 520 may disconnect the virtual ground VSSV from the ground VSS in response to the mode control signal SL.

When the logic circuit 510 operates in active mode, the second control unit 550 may connect the virtual power supply VDDV to a power supply VDD in response to an inverted mode control signal SLB, which may be obtained by inverting the mode control signal SL. When the logic circuit 510 operates in sleep mode, the second control unit 550 may disconnect the virtual power supply VDD from the power supply VDD in response to the inverted mode control signal SLB.

The voltages inside the first and second control units 520 and 550 may vary according to the operating mode of the logic circuit 510.

The MTCMOS control circuit 600 is different from the MTCMOS control circuit 500 of FIG. 5 in that it may include the second control unit 550 and a second body control signal generation unit 560.

The logic circuit 510, the first control unit 520, a mode control signal generation unit 540, and a first body control signal generation unit 530 of FIG. 6 may correspond to the logic circuit 510, the control unit 520, the mode control signal generation unit 540, and the body control signal generation unit 530, respectively, of FIG. 5, and thus, their detailed descriptions will be omitted.

The second control unit 550 may be a PMOS transistor MP which is connected between the virtual power supply VDDV and the power supply VDD and has a gate to which the inverted mode control signal SLB is applied. The body voltage of the PMOS transistor MP may vary according to the operating mode of the logic circuit 510.

For example, the body voltage of the PMOS transistor MP may decrease when the logic circuit 510 operates in active mode and may increase when the logic circuit 510 operates in sleep mode.

When the logic circuit 510 operates in active mode, the PMOS transistor MP may be turned on in response to the inverted mode control signal SLB. The virtual power supply VDDV may be connected to the power supply VDD, thus reducing the body voltage of the PMOS transistor MP.

The threshold voltage and internal resistance of the PMOS transistor MP decrease. Therefore, the voltage of the virtual power supply VDDV decreases less considerably than the voltage of the power supply VDD so that the voltage of the virtual power supply VDDV eventually becomes almost equal to the voltage of the power supply VDD.

Thus, the reveres body bias effect of the PMOS transistors (not shown) in the logic circuit 510 may be reduced or minimized, and the performance of the logic circuit 510 may be improved.

When the logic circuit 510 operates in sleep mode, the PMOS transistor MP may be turned on in response to the inverted mode control signal SLB. The logic circuit 510 may also be powered down, thereby increasing the body voltage of the PMOS transistor MP.

The threshold voltage of the PMOS transistor MP may increase considerably, and the amount of leakage current may decrease. When the logic circuit 510 operates in sleep mode, the amount of leakage current decreases.

As described above, the body voltage of the PMOS transistor MP may increase in one operating mode of the logic circuit 510 and may decrease in another operating mode of the logic circuit 510. Alternatively, the PMOS transistor MP may be designed so that its body voltage increases or decreases in one operating mode of the logic circuit 510, but does not change in another operating mode of the logic circuit 510.

For example, the PMOS transistor MP may be designed so that its body voltage decreases when the logic circuit 510 operates in active mode and does not change when the logic circuit 510 operates in sleep mode. The reverse body bias effect may be reduced or prevented when the logic circuit 510 operates in active mode, and thus, the performance of the logic circuit 510 may be improved.

The PMOS transistor MP may be designed so that its body voltage does not change when the logic circuit 510 operates in active mode and increases when the logic circuit 510 operates in sleep mode. The amount of leakage current generated when the logic circuit 510 is powered down, and is thus put in sleep mode, may be reduced.

The MTCMOS control circuit 600 may also include the second body control signal generation unit 560. The second body control signal generation unit 560 may generate a body control signal BDS2 having a voltage lower than a power supply voltage when the logic circuit 510 operates in active mode and may generate a second body control signal BDS2 having a voltage equal to or higher than the power supply voltage when the logic circuit 510 operates in sleep mode.

For example, the second body control signal generation unit 560 may include a third switch SW3 and a fourth switch SW4. The third switch SW3 may generate a second body control signal BDS2 having a voltage lower than the power supply voltage from a third voltage source V3 in response to the inverted mode control signal SLB when the logic circuit 510 operates in active mode. The inverted mode control signal SLB may be generated by an inverter INV inverting the mode control signal SL.

The third switch SW3 may be a PMOS transistor. When the logic circuit 510 operates in active mode, the mode control signal SL may have a logic high level, and thus, the inverted mode control signal SLB may have a logic low level. The third switch SW3 is turned on and may generate the second body control signal BDS2 having a voltage lower than the power supply voltage from the third voltage source V3. The second body control signal BDS2 generated by the third switch SW3 may reduce the body voltage of the PMOS transistor MP3.

The fourth switch SW4 may generate a second body control signal BDS2 having a voltage equal to or higher than the power supply voltage from a fourth voltage source V3 in response to the inverted mode control signal SLB when the logic circuit 510 operates in sleep mode.

The fourth switch SW4 may be an NMOS transistor. When the logic circuit 510 operates in sleep mode, the mode control signal SL may have a logic low level, and the inverted mode control signal SLB may have a logic high level. The fourth switch SW4 may turn on and generate a second body control signal BDS2 having a voltage equal to or higher than the power supply voltage from the fourth voltage source V4. The second body control signal BDS2 generated by the fourth switch SW4 may increase the body voltage of the PMOS transistor MP.

The MTCMOS control circuit 600 may improve the performance of the logic circuit 510 and/or may reduce the amount of leakage current.

As described above, the MTCMOS control circuit according to example embodiments of the present invention may reduce or prevent the performance a logic circuit from deteriorating due to the reveres body bias effect when the logic circuit operates in active mode and may reduce the amount of leakage current generated when the logic circuit operates in sleep mode.

Although example embodiments of the present invention are described in conjunction with MTCMOS control circuits and methods, any other control circuits and methods may also be used.

While the present invention has been particularly shown and described with reference to example embodiments thereof, it will be understood by those of ordinary skill in the art that various changes in form and details may be made therein without departing from the spirit and scope of the present invention as defined by the following claims.

What is claimed is:

1. A control circuit comprising:
a first control unit, controlling a logic circuit, the logic circuit being connected between a power supply and a virtual ground, the first control unit connecting the virtual ground to a ground in response to a mode control signal when the logic circuit operates in an active mode and disconnecting the virtual ground from the ground in response to the mode control signal when the logic circuit operates in a sleep mode, wherein the first control unit includes a transistor connected between the virtual ground and the ground having a gate to which the mode control signal is applied, and a body of the transistor is connected to a voltage lower than the ground voltage when the logic circuit operates in the sleep mode.

2. The control circuit of claim 1, wherein an internal voltage of the first control unit varies according to the operating mode of the logic circuit.

3. The control circuit of claim 2, wherein the transistor is an NMOS transistor, the body voltage of the NMOS transistor varying according to the operating mode of the logic circuit.

4. The control circuit of claim 3, wherein the body voltage of the NMOS transistor increases when the logic circuit operates in the active mode and decreases when the logic circuit operates in the sleep mode.

5. The control circuit of claim 3, wherein the body voltage of the NMOS transistor increases when the logic circuit operates in the active mode and does not change when the logic circuit operates in the sleep mode.

6. The control circuit of claim 3, wherein the body voltage of the NMOS transistor does not change when the logic circuit operates in the active mode and decreases when the logic circuit operates in the sleep mode.

7. The control circuit of claim 3, further comprising a body control signal generation unit which controls the body voltage of the NMOS transistor by generating a body control signal having a voltage higher than a ground voltage when the logic circuit operates in the active mode.

8. The control circuit of claim 7, wherein the body control signal generation unit comprises:
a first switch which generates the body control signal having a voltage higher than the ground voltage from a first voltage source in response to the mode control signal when the logic circuit operates in the active mode; and a second switch which generates the body control signal having a voltage equal to or lower than the ground voltage from a second voltage source in response to the mode control signal when the logic circuit operates in the sleep mode.

9. The control circuit of claim 1, further comprising a mode control signal generation unit which generates the mode control signal, wherein the mode control signal has a logic high level when the logic circuit operates in the active mode and has a logic low level when the logic circuit operates in the sleep mode.

10. The control circuit of claim 1, further comprising
a second control unit connecting the virtual power supply to a power supply in response to an inverted mode control signal when the logic circuit operates in the active mode and disconnects the virtual power supply from the power supply in response to the inverted mode control signal when the logic circuit operates in the sleep mode, the inverted mode control signal being generated by inverting the mode control signal.

11. The control circuit of claim 10, wherein an internal voltage of the first control unit and the second control unit vary according to the operating mode of the logic circuit.

12. The control circuit of claim 11, wherein the second control unit includes a PMOS transistor connected between the virtual power supply and the power supply having a gate to which the inverted mode control signal is applied, a body voltage of the PMOS transistor varying according to the operating mode of the logic circuit.

13. The control circuit of claim 12, wherein the body voltage of the PMOS transistor decreases when the logic circuit operates in the active mode and increases when the logic circuit operates in the sleep mode.

14. The control circuit of claim 12, wherein the body voltage of the PMOS transistor decreases when the logic circuit operates in the active mode and does not change when the logic circuit operates in the sleep mode.

15. The control circuit of claim 12, wherein the body voltage of the PMOS transistor does not change when the logic circuit operates in the active mode and increases when the logic circuit operates in the sleep mode.

16. The control circuit of claim 12, further comprising a body signal generation unit which controls the body voltage of the PMOS transistor by generating a body control signal having a voltage lower than a power supply voltage when the logic circuit operates in the active mode and generating a body control signal having a voltage equal to or higher than the power supply voltage when the logic circuit operates in the sleep mode.

17. The control circuit of claim 16, wherein the body control signal generation unit comprises:
a first switch which generates the body control signal having a voltage lower than the power supply voltage from a first voltage source in response to the inverted mode control signal when the logic circuit operates in the active mode;
a second switch which generates the body control signal having a voltage equal to or higher than the power supply voltage from a second voltage source in response to the inverted mode control signal when the logic circuit operates in the sleep mode; and
an inverter which generates the inverted mode control signal by inverting the mode control signal.

18. The control circuit of claim 1, wherein the logic circuit has a relatively low threshold voltage and the first control unit has a relatively high threshold voltage.

19. The control circuit of claim 1, wherein the control circuit is a multi-threshold complementary metal-oxide semiconductor (MTCMOS) control circuit.

20. The control circuit of claim 1, wherein the transistor is an NMOS transistor.

21. A method of controlling a logic circuit, comprising:
connecting the logic circuit between a power supply and a virtual ground;
connecting the virtual ground to a ground in response to a mode control signal when the logic circuit operates in an active mode; and
disconnecting the virtual ground from the ground in response to the mode control signal when the logic circuit operates in a sleep mode, and
connecting a body of a transistor of the logic circuit to a voltage lower than the ground voltage when the logic circuit operates in the sleep mode.

* * * * *